United States Patent [19]

Lewis et al.

[11] 4,417,683

[45] Nov. 29, 1983

[54] CENTERING DEVICE FOR ELECTRICAL COMPONENTS

[75] Inventors: Alan C. Lewis; Phillip A. Ragard, both of Binghamton; Robert C. Shiptenko, Johnson City, all of N.Y.

[73] Assignee: Universal Instruments Corporation, Binghamton, N.Y.

[21] Appl. No.: 319,405

[22] Filed: Nov. 9, 1981

[51] Int. Cl.³ .................... B23P 19/04; H01R 43/04
[52] U.S. Cl. ..................................... 227/109; 29/739; 29/741; 227/82; 227/87; 227/91; 227/119
[58] Field of Search ............... 29/739, 741, 837, 838; 227/2, 3, 4, 5, 78, 79, 80, 81, 82, 83, 84, 85, 86, 87, 88, 89, 90, 91, 119, 109, 155

[56] References Cited

U.S. PATENT DOCUMENTS

| Re. 27,968 | 4/1974 | Ragard et al. | 227/2 |
| 2,808,587 | 10/1957 | Hancock | 227/2 |
| 2,896,213 | 7/1959 | Alderman et al. | 227/1 X |
| 2,961,027 | 11/1960 | Ullman et al. | 227/2 X |
| 2,982,967 | 5/1961 | Dingelstedt | 227/90 |
| 3,167,780 | 2/1965 | Mueller | 227/90 X |
| 3,291,359 | 12/1966 | Butterworth et al. | 227/155 |
| 3,488,672 | 1/1970 | Martyn | 227/88 X |
| 3,593,404 | 7/1971 | Ragard | 227/79 |
| 3,594,889 | 7/1971 | Clark | 227/109 X |
| 3,796,363 | 3/1974 | Ragard | 227/2 |
| 4,197,638 | 4/1980 | Asai et al. | 227/109 X |
| 4,313,251 | 2/1982 | Asai et al. | 29/739 X |

FOREIGN PATENT DOCUMENTS 639679 12/1978 U.S.S.R. ................ 29/741

Primary Examiner—Paul A. Bell
Attorney, Agent, or Firm—Fidelman, Wolffe & Waldron

[57] ABSTRACT

Electrical components are processed faster and more reliably with an improved centering device. In one embodiment, thread slack is provided in the relatively slow adjuster used to preset a component processing machine to a particular insertion span, and a faster acting adjuster makes use of this thread slack to vary the preset span and center the component body in the machine.

6 Claims, 10 Drawing Figures

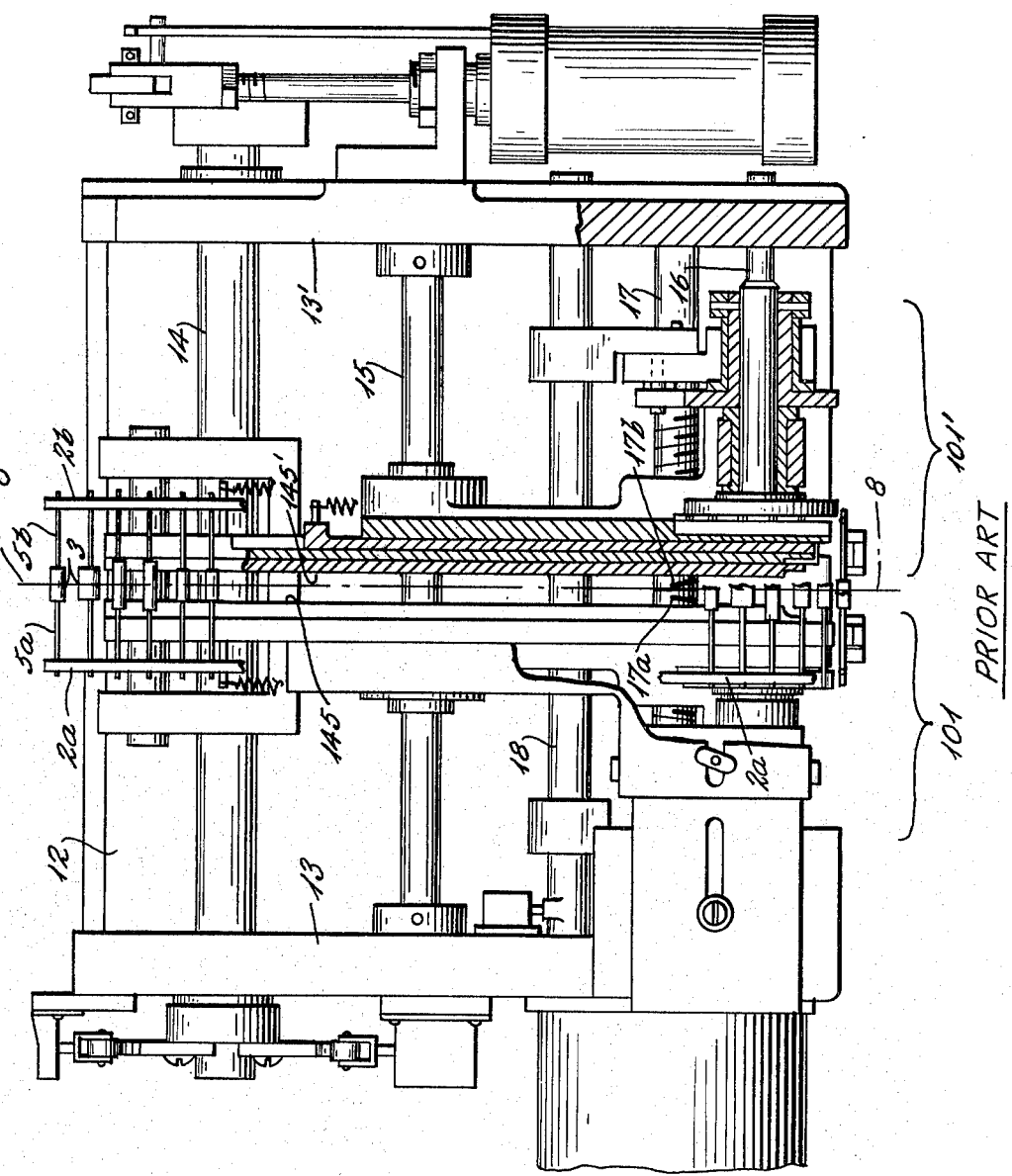

CENTERING DEVICE FOR ELECTRICAL COMPONENTS

CROSS-REFERENCES TO PRIOR ART (1) U.S. Pat. No. Re. 27,968—MULTISIZE VARIABLE CENTER ELECTRONIC COMPONENT INSERTION MACHINE—Ragard, et al.
(2) U.S. Pat. No. 3,593,404—MULTISIZE DUAL CENTER DISTANCE ELECTRONIC COMPONENT INSERTION MACHINE—Ragard

BACKGROUND OF THE INVENTION

The present invention is directed to an improved centering device for axial lead components and more particularly to a device for centering the bodies of varying lengths of successively presented components.

The above-referenced U.S. Pat. No. Re. 27,968 describes a machine constructed to feed tape-carried axial lead components to an insertion head which is adapted, in sequence: to adjust the head for reception of component bodies of various lengths; to sever the leads of a component in order to separate such component from a pair of spaced carrier tapes; to bend the severed leads at right angles to the axis of the separated component; and to drive the bent leads into preformed apertures provided in a circuit board disposed below the insertion head. The adjustment of the head for different body lengths is provided by variable spacing of two movable sections of the head through means of a lead screw having a pair of equally spaced and oppositely threaded screw portions, each of which is threadedly received in one of the sections, so that rotation of the lead screw in either direction will effect the spacing of the sections and thus the amount severed from the leads and the location of the bend in the unsevered portions of the leads. The other above-referenced prior art, U.S. Pat. No. 3,593,404 describes a similar variation except that only two different spacings are provided by means of stops and a piston and cylinder arrangement whereby the sections are moved from one set of stops to another through actuation of the piston and cylinder. Neither of these references addresses centering of the present body between the sections prior to lead severing, forming, and inserting so that lead bending can be accomplished as close as possible to the body and thus allow smaller aperture spacing in the circuit board and denser population of the components on the circuit board.

Because of the centering tolerances of the machine (not shown) for sequencing and taping these components, uncentered components must be centered prior to or during subsequent processing. Otherwise, limits must be imposed upon subsequent processing devices to prevent damage to the components. For instance, in the above-patented devices, limits are imposed upon the closeness to which the sections may be variably spaced for particular body lengths in order to ensure that one end of an uncentered body will not be damaged during the insertion operation. In an effort to overcome this problem and to ensure that leads may be bent closer to the component bodies, programs and controls have been proposed and implemented whereby the sections are opened by the lead screw, from an approximate lead spacing for a particular component, to a large enough spacing that an uncentered component body will fit between the lead formers; then the spacing is narrowed by the lead screw to engage at least one of the formers with an end of the body for better centering thereof prior to the lead severing, forming and inserting operations. This added centering step, although very accurate, has slowed the component processing by approximately 40%, a significant reduction in speed from that needed for today's production requirements.

Accordingly, a need has been demonstrated for fast, accurate centering of axial lead, electrical components such that production speeds are not significantly reduced.

BRIEF SUMMARY OF THE INVENTION

The instant invention provides centering of electrical components between two variably spaced members by variably presetting the members to an approximate spacing for a particular component, then quickly widening the approximate spacing to ensure reception of the component body between the members, and thereafter quickly narrowing the spacing so that at least one end of the body is engaged by one of the members to improve the centering thereof. A double-acting cylinder and piston arrangement provides centering speed which is far superior to that of a lead screw.

In one embodiment of the invention, a retrofit improvement to the device of U.S. Pat. No. Re. 27,968, the threads of the moveable sections are undercut so that a certain amount of slack or play is provided between these sections and the unmodified lead screw threads; each end of a double-acting cylinder is attached to a moveable section so that approximate spacing of the sections is provided by the programmed lead screw actuation and faster modification of this spacing is provided by the double-acting cylinder opening and closing the sections slightly, according to the amount of thread slack provided. The threads of the lead screw or both cooperating threads could be modified to provide the slack, although it is preferred to alter only the threads in the moveable sections.

In the utilization of another embodiment of the invention, internally threaded sleeves mate with the lead screw threads in the normal manner, and the external, unthreaded surfaces of the sleeves act as bearings so that the moveable sections may telescope thereon to provide a displacement similar to the above-described slack. Again, a double-acting cylinder was used to provide this additional displacement of the sections, although other means which would provide the required speed could be utilized.

BRIEF DESCRIPTION OF THE DRAWINGS

FIG. 2 is a front plan view, partially broken away, of a prior art device to wihch the instant invention may be applied.

DETAILED DESCRIPTION OF THE INVENTION

Figure 1:
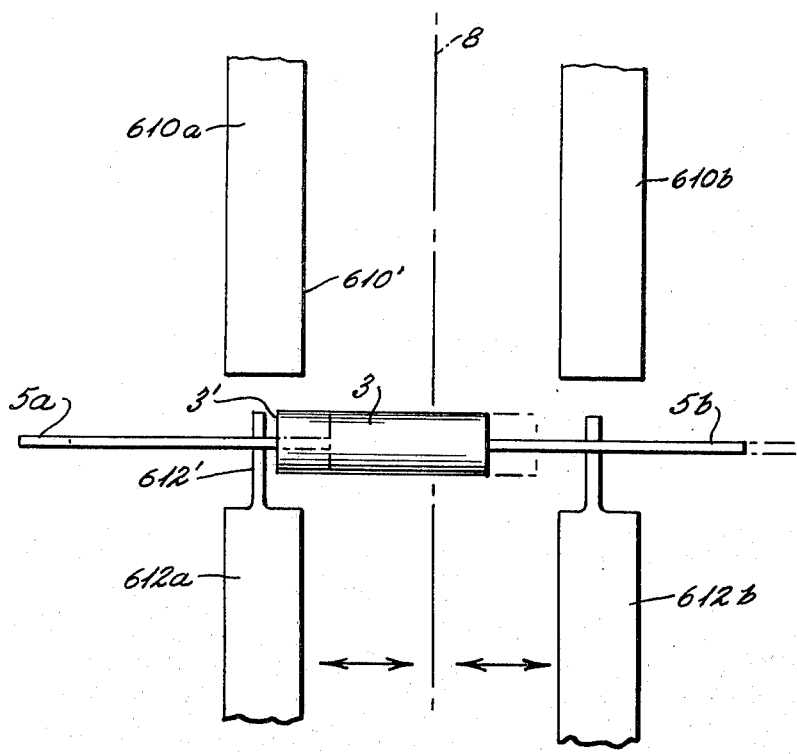
FIG. 1 illustrates the inventive concept as applied to an uncentered component in a processing station.

Referring to FIG. 1 for an understanding of the field of invention, an axial lead electrical component having a body 3 and leads 5a, 5b has been presented to a processing station in an uncentered condition. If the component were operated upon while in this condition, as in downward movement of spaced members 610a and 610b, the lefthand end 3' of body 3 would be contacted and improper processing could occur. As may be appreciated from the drawing, a slight shifting of body 3 to the right, so that end surface 3' is cleared by surface 610' during its downward movement, often is all that is necessary for proper processing of the component. To accomplish this clearance, body 3 could be shifted rightward by shifting member 612a into engagement with body surface 3'. Likewise, if the component body 3 were offset to the right of midplane 8, member 612b could serve the shifting function. Therefore, to cover both "uncentered" circumstances, members 612a and 612b should be moved toward and away from each other in concert. Further, exact centering of body 3 relative to midplane 8 would be possible, although unnecessary for most component processing operations. Attention is now directed to the remaining drawings for specific applications of the invention.

A specific utilization of the invention has been with variable center distance (V.C.D.) electronic component insertion machines of the type described in U.S. Pat. No. Re. 27,968, a front view of which is illustrated in FIG. 2. This machine has a fixed U-shaped support with back 12 and sides 13, 13'; and rods 14, 15, 16 and 18 are for slidingly supporting variable spaced sections 101, 101'. The variable spacing is provided by a shaft 17 having equally pitched, oppositely threaded screw portions 17a, 17b which are threadedly engaged in sections 101, 101', respectively, so that rotation of shaft 17 in opposite directions causes opening and closing of these sections relative to midplane 8. This opening and closing of sections 101, 101' allows variation of the spacing therebetween so that component bodies 3, of different lengths and mounted on tapes 2a, 2b for feeding, may be accommodated to different hole spacings on circuit boards after shortening and bending of leads 5a, 5b.

Figure 3:
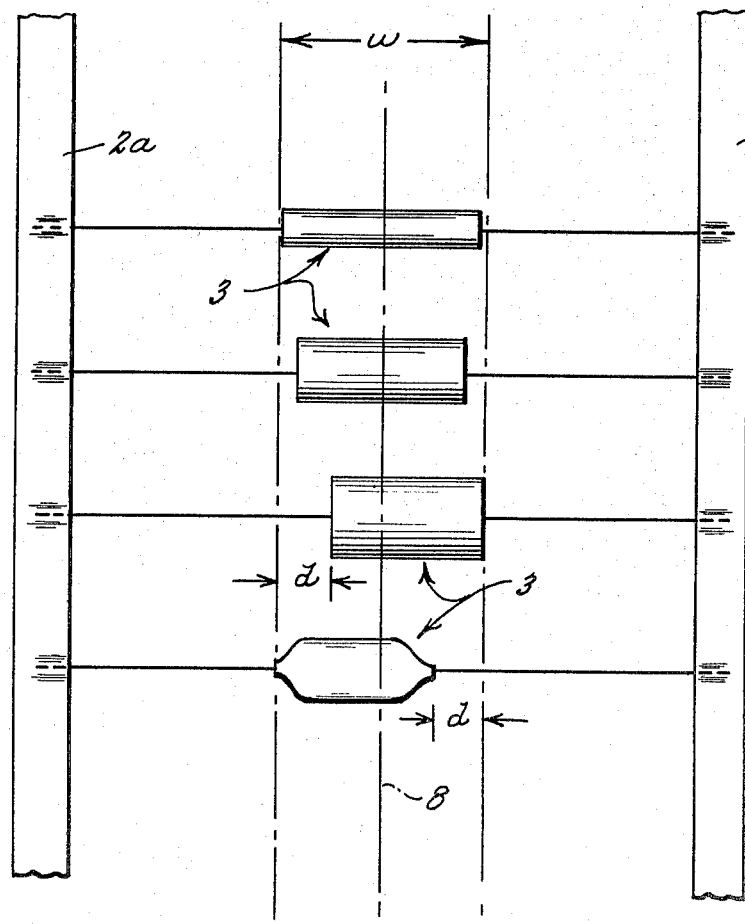
FIG. 3 is a partial top plan view of taped, sequenced electrical components.
Figure 4:
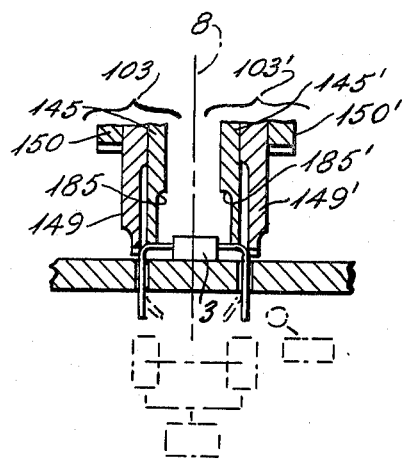
FIGS. 4, 5, and 6 are partial cross-sections illustrating various processing steps in one embodiment of the invention.
Figure 5:
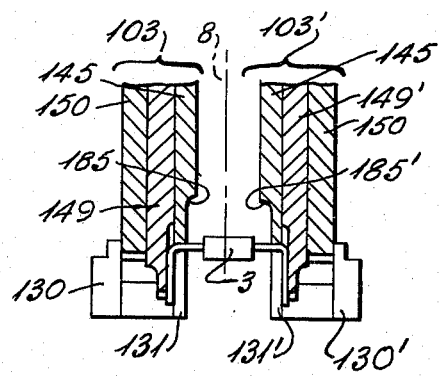
Figure 6:
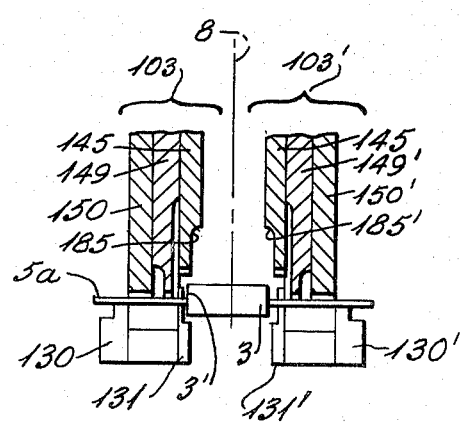

Referring to FIG. 3, different components are fed to the above machine in a programmed sequence, as provided by a sequencing and taping machine (not shown). Because of the tolerances of the taping machine, bodies 3 of different lengths are taped so that they remain within a "window" of margin "w", but may be displaced in either direction by as much as a distance "d" and thus be uncentered relative to midplane 8. Further, because of this uncentered condition, the insertion machine is limited as to how much the spacing between section 101, 101' may be narrowed. Prior to drivers 145, 145' moving downward to drive the component leads 5a, 5b into circuit board holes 6a, 6b (as in FIG. 4), leads 5, 5a are bent or formed by the cooperation of inside formers 131, 131' and outside formers 149, 149' as seen in FIG. 5; and prior to this forming operation, cutters 150, 150' cooperate with cutting dies 130, 130' (as in FIG. 6) to engage and sever leads 5, 5a and remove the components from the tapes 2a, 2b. Because of uncentered, taped components being presented to insert tooling 103, 103', as in FIG. 6, the amount of closing of tooling 103, 103' prior to lead severing is limited to insure that body 3 will be cleared by drivers 145, 145' in their downward movement. By further reference to FIG. 6, it can be seen that tooling 103, 103' is not separated enough so that surface 185 of driver 145 will clear end surface 3' of body 3 in the subsequent insertion step. Hence, in order to provide leads 5, 5a with a bend as close as possible to body 3 so that closer circuit board hole spacing can be accommodated, it is desirous to more nearly center body 3 relative to midplane 8 prior to the lead severing operation. To accomplish better centering of the presented components, past efforts have utilized further inward movement of tooling 103, 103', from the preset spacing for a particular required hole spacing, by a programmed further turning of lead screw 17, and engagement of at least one of the inside formers 130, 131' with body 3 prior to the lead severing operation. However, this has slowed down the operation of the V.C.D. machine by as much as 40%.

Figure 7:
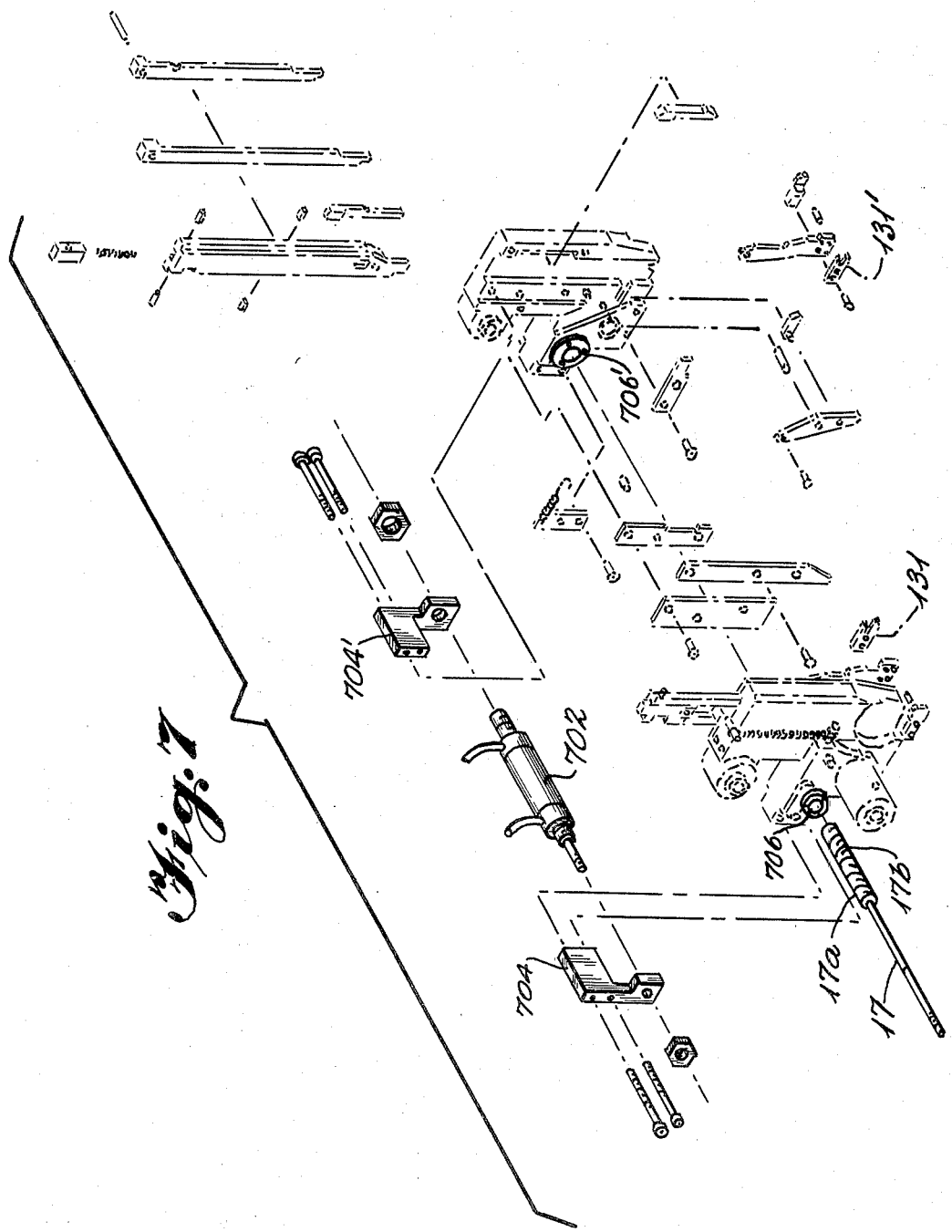
FIG. 7 is an exploded view of one embodiment of the invention as applied to the prior art device of FIG. 2; the prior art is phantom-lined.
Figure 8:
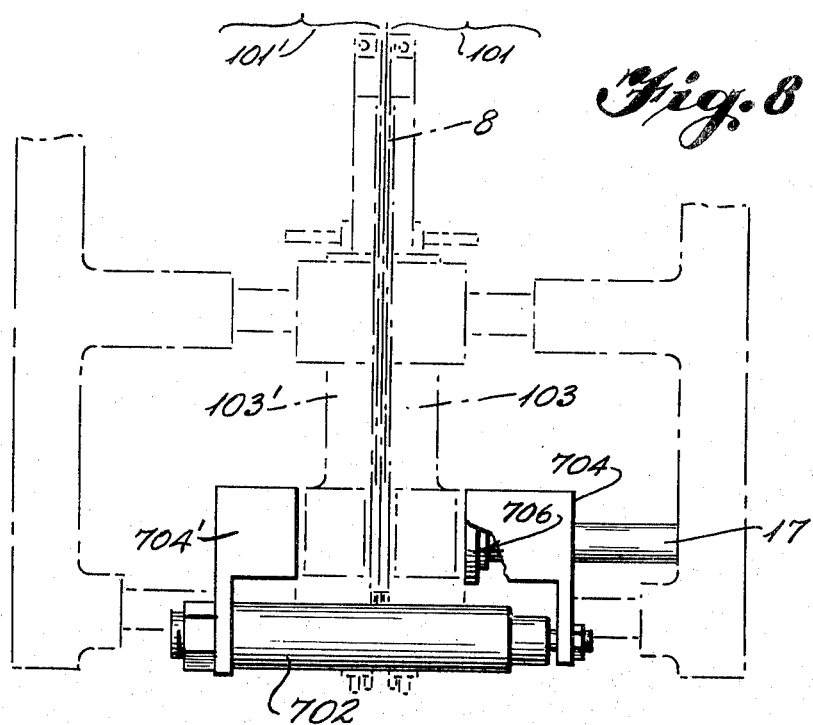
FIG. 8 is a partial rear plan view of the assembled structure of FIG. 7.
Figure 9:
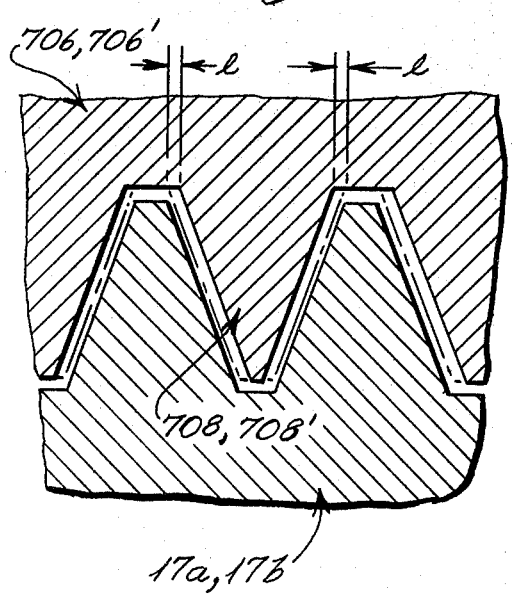
FIG. 9 is an enlarged partial cross-section illustrating the slack between altered threads of one embodiment of the invention; the unaltered threads are indicated by phantom lines.

In order to provide faster component centering than that provided by the additional adjustment of lead screw 17, the instant invention was conceived. The general structure of the invention is best seen in FIGS. 7 and 8. A double-acting cylinder and piston 702 is mounted onto tooling subassemblies 103, 103' by brackets 704, 704' so that further movement may be imparted to sections 101, 101' for centering the presented components. To allow this further movement, the internal threads 708, 708' of tooling subassembly-mounted sleeves 706, 706' have been undercut from their original (phantom-line) size, as best seen in FIG. 9, to provide lateral slack or play between sleeves 706, 706' and lead screw portions 17a, 17b, so that sections 101, 101' may be moved further (in either direction) by double-acting cylinder and piston 702. The speed of this centering movement is far superior to that provided by lead screw 17.

Figure 10:
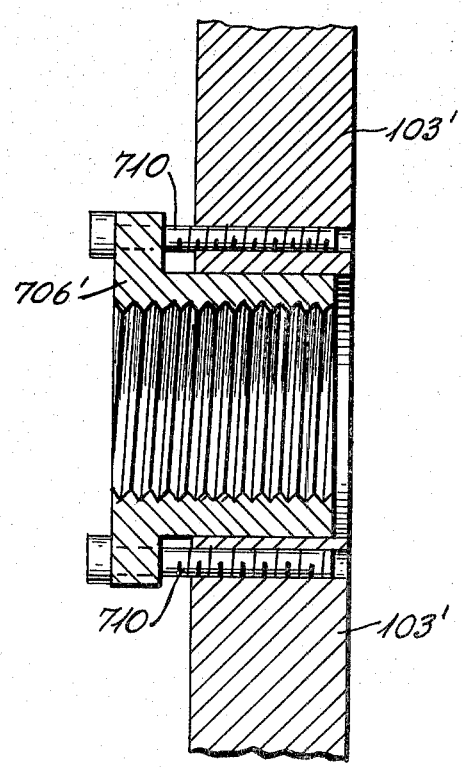
FIG. 10 is a partial cross-section illustrating an alternate embodiment of the invention.

Another manner in which this centering function may be provided is illustrated in FIG. 10, in which no threads are modified. Instead, sleeves 706, 706' are mounted slidably relative to tooling subassemblies 103, 103' by shoulder screws 710. With this arrangement, although there is no slack between the threads of sleeves 706, 706' and lead screw portions 17a, 17b, centering movement of sections 101, 101' is still provided by fast acting cylinder piston 702.

The actuation of cylinder and piston 702 is timed relative to the taped component feed and the insert head tooling stroke such that there is a "race" condition, between the centering movement provided by cylinder and piston 702 and the movement of cutters 150, 150', prior to engagement of leads 5a, 5b. The centering function is always done prior to lead cutting with a speed that causes negligible, if any, slow-down in processing of the components.

For the first embodiment, it has been found that a thread undercutting of 0.0125 inches, providing a slack amount of 0.025 inches for movement of each section 101, 101', accomplishes the desired centering result. A similar amount of movement was provided by the second embodiment. Model 041-DP double-acting air cylinder, manufactured by BIMBA Mfg. Co. of Monee, Ill., was used in both embodients.

While only two utilizations of the present invention have been described in detail, various modifications thereof and additions thereto will become apparent to those skilled in the art in view of the foregoing description. For example, the invention has been described for use specifically with axial lead components having single leads extending from each end thereof, while one skilled in the art would recognize that the axial lead component could have more than one lead extending from an end with suitable provision being made in the operating mechanism to cut, bend and insert the multiple leads. Further, it will likely occur to one skilled in the art that the present invention has utility in processing components where it is desired to perform one or more of the cutting, bending, and inserting operations to provide processed components which may thereafter be further processed by other apparatus. Still further, the modified thread concept of the invention could be used in any other processing where quick, reliable centering of a part is desired.

Accordingly, the scope of protection for the present invention is to be limited only by the scope of the appended claims.

We claim:

1. An apparatus for centering the uncentered bodies of electrical components each body having leads extending from opposite ends thereof, said apparatus comprising:

first and second sections movable toward and away from each other for reception of said body therebetween;

first and second means for varying the spacing between said sections, said first spacing varying means capable of providing a first spacing variation larger than a second spacing variation provided by said second spacing varying means;

said first spacing varying means comprising a shaft having oppositely threaded equally spaced screw portions and threaded means in each of said sections for receiving one of said screw portions in a threaded relation having slack, and means for selectively rotating said shaft in opposite directions to open and close said spacing to a predetermined spacing of said sections; and said second spacing varying means comprising means for removing said slack in said threaded relation such that said spacing is widened relative to said predetermined spacing for reception of said body between said sections to prevent engagement of said sections with said body and said spacing is subsequently narrowed relative to said predetermined spacing to engage at least one of said sections with one of said uncentered body ends and center said component upon actuation of said slack removing means.

2. An apparatus as in claim 1, wherein said slack removing means comprises piston and cylinder means attached between said sections for providing movement to said sections upon command.

3. An apparatus as in claim 2, wherein said piston and cylinder means comprises a double-acting cylinder and piston.

4. An apparatus for centering the uncentered bodies of electrical components each body having leads extending from opposite ends thereof, said apparatus comprising:

first and second sections movable toward and away from each other for reception of said body therebetween;

first and second means for varying the spacing between said sections, said first spacing varying means capable of providing a first spacing variation larger than a second spacing variation provided by said second spacing varying means;

said first spacing varying means comprising a shaft having oppositely threaded equally spaced screw portions and means in each of said sections for threadedly receiving one of said screw portions and means for selectively rotating said shaft in opposite directions to open and close said spacing to a predetermined spacing of said sections; and said second spacing varying means comprising a sleeve having an external bearing portion telescopically received in each section and a threaded internal portion providing said screw portion receiving means, and means for telescoping said sections inward and outward relative to said sleeves such that said spacing is widened relative to said predetermined spacing for reception of said body between said sections to prevent engagement of said sections with said body, and said spacing is subsequently narrowed relative to said predetermined spacing to engage at least one of said sections with one of said uncentered body ends and center said component.

5. An apparatus as in claim 4, wherein said means for telescoping comprises:

piston and cylinder means attached between said sections for providing movement to said sections upon command.

6. An apparatus as in claim 5, wherein said piston and cylinder means comprises a double-acting cylinder and piston.

* * * * *